(12) United States Patent
Park

(10) Patent No.: US 6,730,531 B2
(45) Date of Patent: May 4, 2004

(54) METHOD FOR FORMING QUANTUM DOT

(75) Inventor: Sung-Eon Park, Ichon-shi (KR)

(73) Assignee: Hynix Semiconductor Inc., Ichon (JP)

( * ) Notice: Subject to any disclaimer, the term of this patent is extended or adjusted under 35 U.S.C. 154(b) by 0 days.

(21) Appl. No.: 10/320,402

(22) Filed: Dec. 17, 2002

(65) Prior Publication Data
US 2004/0053469 A1 Mar. 18, 2004

(30) Foreign Application Priority Data
Sep. 17, 2002 (KR) .................. 10-2002-0056462

(51) Int. Cl.[7] .................. H01L 21/00; H01L 21/20; H01L 21/36
(52) U.S. Cl. .................. 438/22; 438/478; 438/962
(58) Field of Search .................. 438/22, 478, 962, 438/24, 36, 260, 592, 585

(56) References Cited

U.S. PATENT DOCUMENTS

| 5,118,634 | A | | 6/1992 | Neudeck et al. | |
|---|---|---|---|---|---|
| 6,285,055 | B1 | * | 9/2001 | Gosain et al. | 438/260 |
| 6,546,031 | B1 | * | 4/2003 | Jewell et al. | 257/E33.008 |
| 6,573,169 | B2 | * | 6/2003 | Noble et al. | 438/592 |
| 6,596,555 | B2 | * | 7/2003 | Bensahel et al. | 438/22 |
| 6,599,133 | B2 | * | 7/2003 | Nikolaev et al. | 438/22 |
| 6,621,842 | B1 | * | 9/2003 | Dapkus | 372/45 |
| 6,642,546 | B2 | * | 11/2003 | Kuramoto et al. | 257/94 |
| 6,648,975 | B2 | * | 11/2003 | Suzuki et al. | 118/722 |

* cited by examiner

Primary Examiner—John F. Niebling
Assistant Examiner—Walter L. Lindsay, Jr.
(74) Attorney, Agent, or Firm—Jacobson Holman PLLC

(57) ABSTRACT

The present invention relates to a method for forming a plurality of quantum dots providing simultaneously reliability and massproduction effects. The present invention includes the steps of: a method for forming a quantum dot, including the steps of: forming a first insulating layer on a semiconductor substrate; forming an opening that exposes the semiconductor substrate by etching the first insulating layer; forming a single crystal semiconductor layer in the opening and on the first insulating layer adjacent to the opening; and forming a quantum dot on the first insulating layer adjacent to the opening by removing the single crystal semiconductor layer in the opening and portions of the singly crystal layer on the first insulating layer adjacent to the opening.

12 Claims, 6 Drawing Sheets

METHOD FOR FORMING QUANTUM DOT

FIELD OF THE INVENTION

The present invention relates to a method for fabricating a semiconductor device; and, more particularly, to a method for forming a quantum dot.

DESCRIPTION OF RELATED ARTS

In accordance with a current scale-down trend due to advanced levels of integration in a semiconductor device, the total number of electrons existing in channel regions will be also decreased by a few tens of electrons.

As the number of electrons necessary for driving the semiconductor device decreases, a percentage of electrons corresponding to a statistic error among those electrons for driving the semiconductor device conversely increase. This increased percentage of the electrons has a severe impact on reliability of the semiconductor device. Therefore, it is evidently required to develop a new structure of the semiconductor device capable of accurately controlling a single electron.

A single electron transistor, recently proposed for coping with the above limitation, is able to control a single electron and drive the semiconductor device even with an extremely low voltage.

In other words, when each of a typical metal-oxide silicon field effect transistor (MOSFET) and the single electron transistor performs the same algorithm, the MOSFET needs about 1000 to about 20000 electrons. However, the single electron transistor needs only about 1 to about several electrons, thereby decreasing power consumption by 1/1000 and further resulting in power-saving and high integration effects.

FIG. 1 is a cross-sectional view showing a single electron transistor in accordance with a prior art.

Referring to FIG. 1, a first insulating layer 12A and a second insulating layer 12B are sequentially deposited on a semiconductor substrate constructed with silicon or Ge—AS. A number of quantum dots are formed on between the first insulating layer 12A and the second insulating layer 12B. Herein, the first insulating layer 12A is a tunneling oxide,. and the second insulating layer 12B is a control oxide.

Subsequently, a gate electrode 14 is formed on the second insulating layer 12B. On both ends of the gate electrode 14, a source area 15 and a drain area 16 are formed within the semiconductor substrate 11.

To construct the single electron transistor, it is very important to form uniformly micronized quantum dots of which size is several nanometers on the first insulating layer 12A corresponding to the gate electrode 14.

There suggested several conventional methods for forming quantum dots. A quantum dot can be formed by using the agglomeration phenomenon achieved from serial steps as following: depositing silicon germanium or a thin metal layer on between oxide layers; growing the oxide layers; and treating the grown oxide layers with a thermal process. Lithography can also be used for directly forming a number of quantum dots, or there is another method for forming quantum dots electrically within a gap between energy bands. Yet, there has not been suggested a method for forming a quantum dot satisfying reliability and massproduction simultaneously.

Also, it is limited to improve properties of the semiconductor device since a quantum dot formed through the conventional method forms mainly multi-crystal silicon.

SUMMARY OF THE INVENTION

It is, therefore, an object of the present invention to provide a method for forming a quantum dot that has a single crystal and satisfy reliability and massproduction simultaneously.

In accordance with an aspect of the present invention, there is provided a method for forming a quantum dot, including the steps of: forming a first insulating layer on a semiconductor substrate; forming an opening that exposes the semiconductor substrate by etching the first insulating layer; forming a single crystal semiconductor layer in the opening and on the first insulating layer adjacent to the opening; and forming a quantum dot on the first insulating layer adjacent to the opening by removing the single crystal semiconductor layer in the opening and portions of the singly crystal layer on the first insulating layer adjacent to the opening.

In accordance with another aspect of the present invention, there is also provided a method for forming a quantum dot, comprising the steps of: forming a sub-layer on a substrate; forming an opening that expose the substrate by etching the sub-layer; forming a conductive layer in the opening and on the sub-layer adjacent to the opening; and forming a quantum dot by leaving portions of the conductive layer on the sub-layer adjacent to the opening.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

FIGS. 2A to 2F are cross-sectional views illustrating a method for forming a quantum dot in accordance with a preferred embodiment of the present invention.

Figure 1:
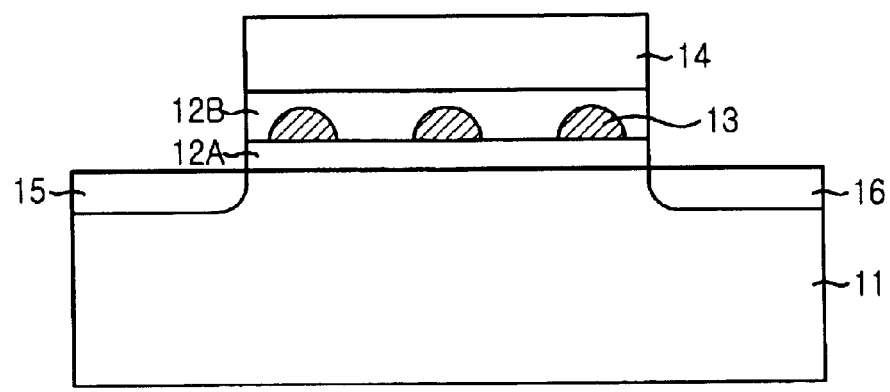
FIG. 1 is a cross-sectional view showing a single electron transistor in accordance with a prior art.
Figure 2A:
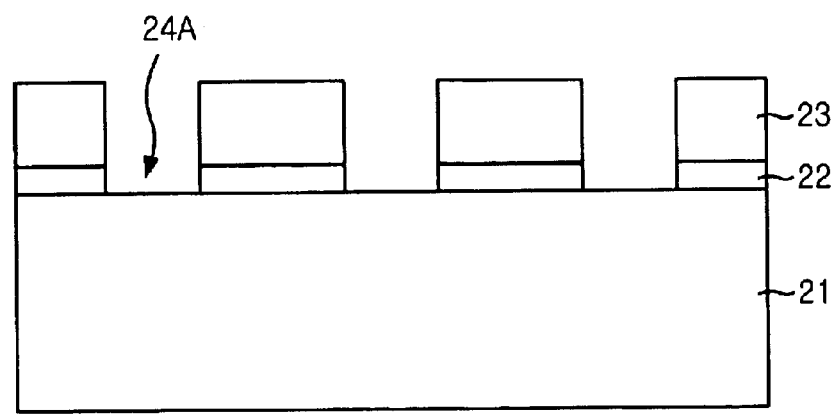
FIGS. 2A to 2F are cross-sectional views illustrating a method for forming a plurality of quantum dots in accordance with a preferred embodiment of the present invention.

Referring to FIG. 2A, a first insulating layer 22 is formed on a semiconductor substrate 21 through an oxidation process or a deposition process. At this time, the first insulating layer 22 is a silicon oxide or a silicon nitride, and the semiconductor substrate 21 is a semiconductor layer including silicon in addition to a silicon layer.

Next, a photosensitive film is coated on the first insulating layer 22 ad patterned through a photo-exposure process and a developing process so as to form a first mask 23. Thereafter, the first insulating layer 22 is proceeded with a dry etching by using the first mask 23 as an etch mask so to form a first opening 24A that expose the substrate 21. Herein, the first opening 24A is the place where a subsequent single crystal silicon layer is grown. Particularly, the substrate 21 exposed within the first opening 24A enacts as a seed layer for growing the single crystal silicon layer.

Figure 2B:
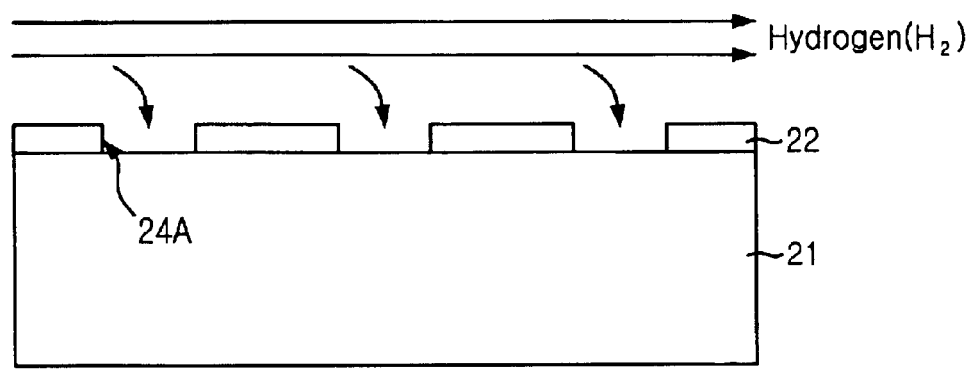
Figure 3A:
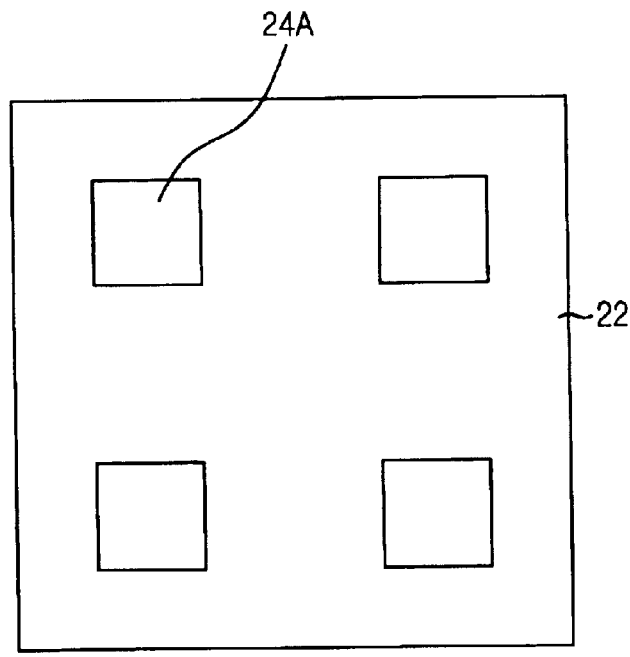
FIGS. 3A to 3D are plane views showing a method for forming quantum dots in accordance with the preferred embodiment of the present invention.

With reference to FIG. 2B, the first mask 23 is removed. FIG. 3A is a plane view showing the first opening 24A and the first insulating layer 22 formed on the substrate(not shown) after removing the first mask 23. The first opening 24A formed by etching the first insulating layer 22 has a square shape. However, the first opening 24A can also have a circular or a crisscross shape. A number of the first openings 24A are neighbored to each other with a consistent distance between them.

Meanwhile, there remained remnants from the etching (not shown) at lateral and lower sides of the first opening 24A. Also, there occurs a lattice defect on a surface of the substrate 21 due to the etching process.

A thermal process is employed to remove the remnants and the lattice defect in an atmosphere of hydrogen or in a vacuum state. This type of thermal process is called a bake process. The bake process also simultaneously removes a native oxide formed on the substrate 21 exposed within the first opening 24A through the bake process.

Figure 2C:
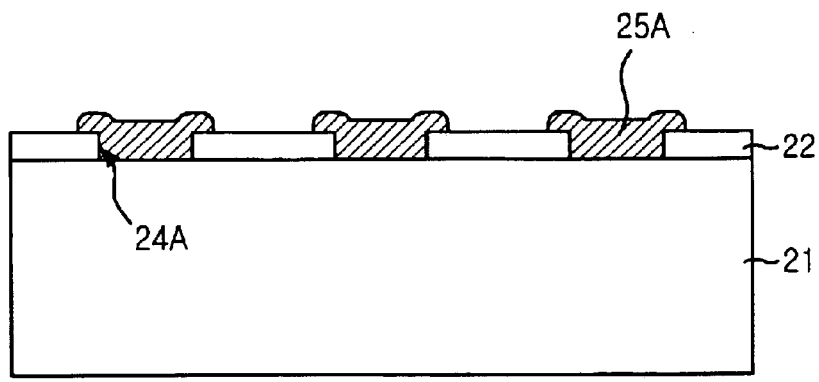

Referring to FIG. 2C, a single crystal silicon layer 25 is formed on the exposed substrate 21 within the first opening 24 with use of a selective epitaxial growth (hereinafter referred as to SEG) technique. At this time, the single crystal silicon layer 25 has a thickness ranging from about 2 nm to about 100 nm. Subsequently, the single crystal silicon layer 25 is gone through the SEG by using the exposed substrate 21 as a seed layer. Simultaneous to the SEG, the single crystal silicon layer 25 is also grown on the first insulating layer 22 adjacent to the first opening 24A due to lateral over-growth.

Figure 3B:
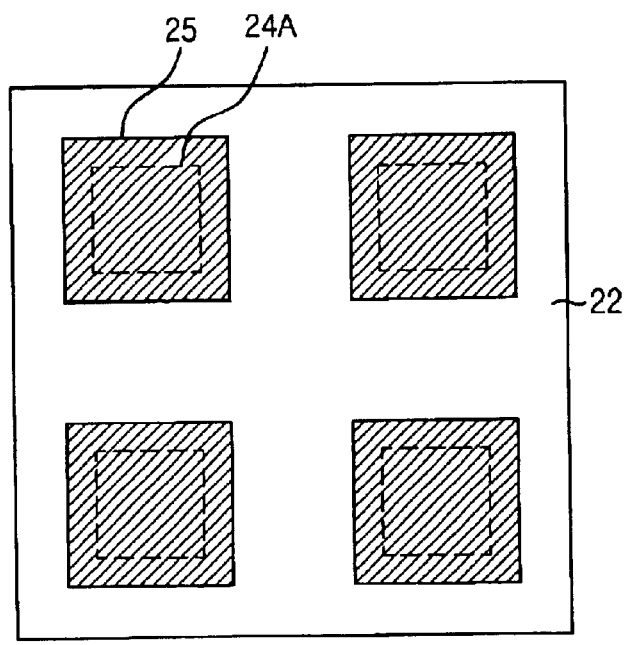

As a result, the single crystal silicon layer 25 fills completely the first opening 24A, and is overlapped on the first insulating layer 22 adjacent to the first opening 24A through the lateral over-growth, which is a unique characteristic of the SEG technique. This overlapping results in enlarged patterns, as shown in o FIG. 3B, which is a plane view showing the silicon layer 25 formed on the substrate(not shown) through the SEG. The single crystal silicon layer 25 has a square shape according to the shape of the first opening 24A. However, the size of the square is bigger than the first opening 24A because of the simultaneous filling of the first opening 24A and the lateral over-growth. However, the neighbored single crystal silicon layers 25 are not contacted to each other.

In the mean time, an ultra high vacuum chemical vapor deposition (UHV CVD) technique is employed to proceed the SEG of the single crystal silicon layer 25. Such mixture as $Si_2H_2Cl_2/H_2/HCl/PH_3$ or $SiH_4/H_2/HCl/PH_3$ can be used as a source gas. Also, controlling a flow quantity of the $PH_3$ gas controls a doping concentration of the single crystal silicon layer 25, thereby controlling electric conductivity and tunneling currents. Furthermore, a flow quantity of the source gas is also controlled to have deposition selectivity to the single crystal silicon layer 25 and the first insulating layer 22.

Figure 2D:
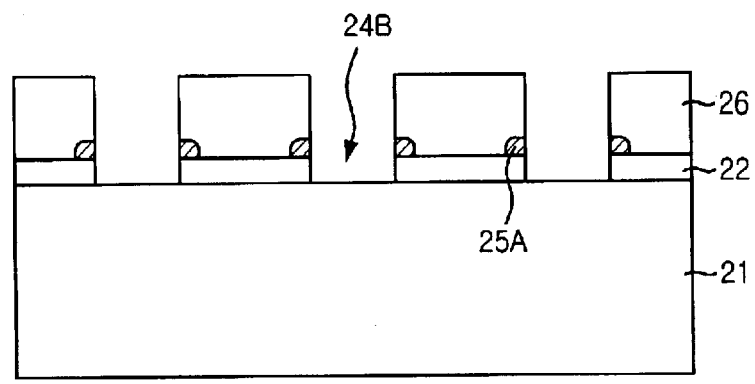

With reference to FIG. 2D, a photosensitive film is coated on the first insulating layer 22 including the single crystal silicon layer 25 and patterned through a photo-exposure and a developing processes so as to form a second mask 26.

Figure 3C:
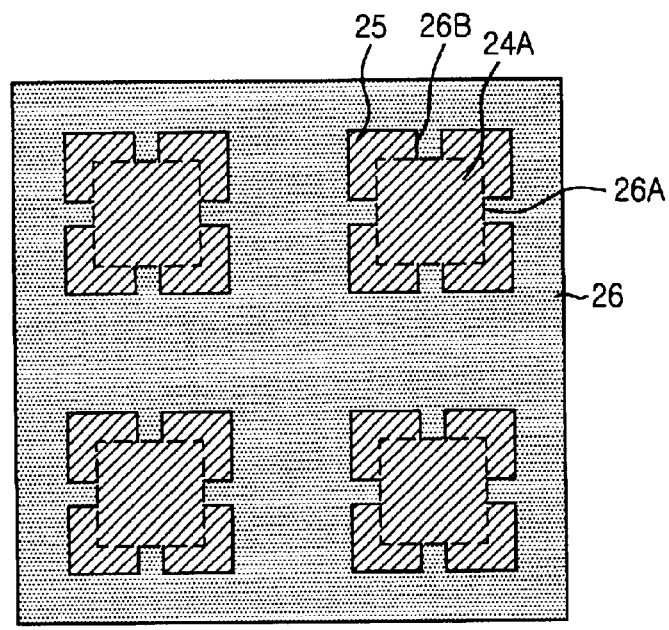

FIG. 3C is a plane view showing the second mask 26 formed on the substrate(not shown). The second mask 26 has a first open area 26A and second open.areas 26B. The first open area 26A exposes the most of the single crystal silicon layer 25 including a central portion that fill the first opening 24A. The second open areas 26B expose portions of the single crystal silicon layer 25 on the first insulating layer 22 adjacent to the first opening 24A.

Next, the exposed single crystal silicon layer 25 is proceeded with a dry etching or a wet etching by using the second mask 26 as an etch mask so as to form a number of quantum dots 25A constructed with the single crystal silicon.

At this time, all portions of the single crystal silicon layer 15 filled within the first opening 24A and the portions of the single crystal layer on the first insulating layer adjacent to the first opening are removed. That is, portions formed by the lateral over-growth on the first insulating layer 22 adjacent to the first opening and covered the second mask 26 are not removed, thereby forming the quantum dot 25A.

Also, a second opening 24B exposed after etching the single crystal silicon layer 25 is different from the first opening 24A shown in FIG. 2A. The second opening 24B is opened as the same area of the single crystal silicon layer excluding the quantum dot 25A. Thus, the second opening 24B has a wider opening than the first opening 24A.

Figure 2E:
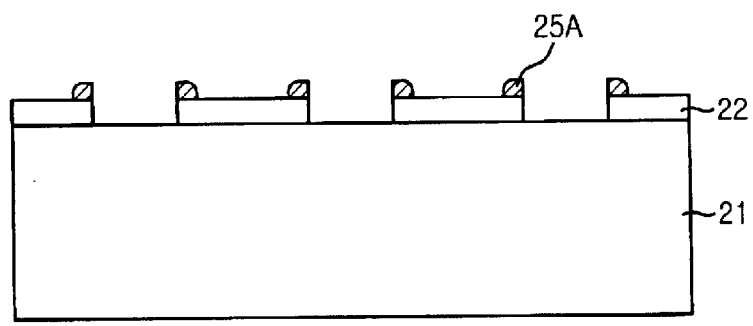
Figure 3D:
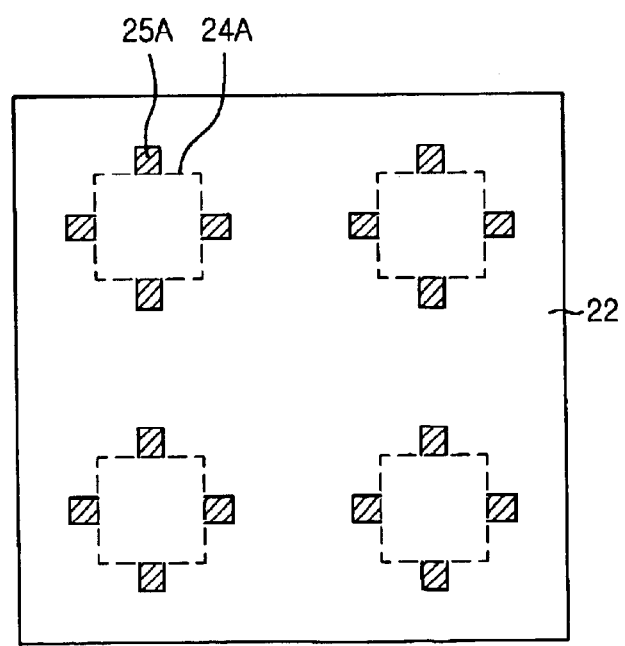

Referring to FIG. 2E, the second mask 26 is subsequently removed. FIG. 3D is a plane view showing quantum dots 25A on the first insulating layer 22 after removing the second mask 26. As shown in FIG. 3D, the quantum dot 25A is formed on the first insulating layer 22 along edges of the first opening 24A in the first insulating layer 22.

Figure 2F:
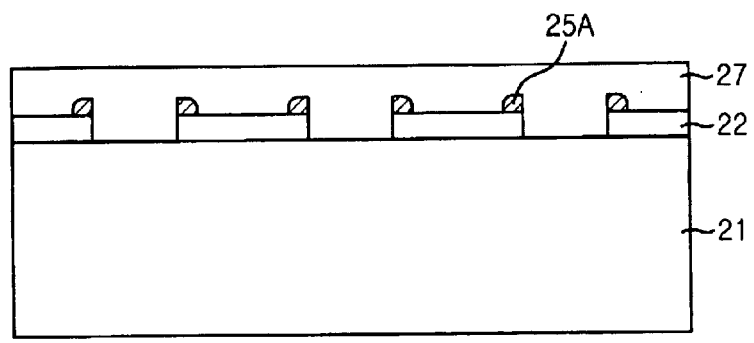

With reference to FIG. 2F, a second insulating layer 27 is formed on the first insulating layer 22 and a number of quantum dots 25A. At this time, the second insulating layer 27 is formed with a silicon oxide layer.

Hence, the pluralities of the quantum dots 25A are positioned between the first insulating layer 22 and the second insulating layer 27. That is, the pluralities of the quantum dots 25A are positioned within the insulating layers.

As described in the above, it is possible to form a uniform quantum dot array by using the lateral over-growth of the SEG technique and the photolithography. Also, it is widely applicable to fabricate a single electron transistor using the method for forming a uniform quantum array and a semiconductor device using the tunneling phenomenon.

Figure 4:
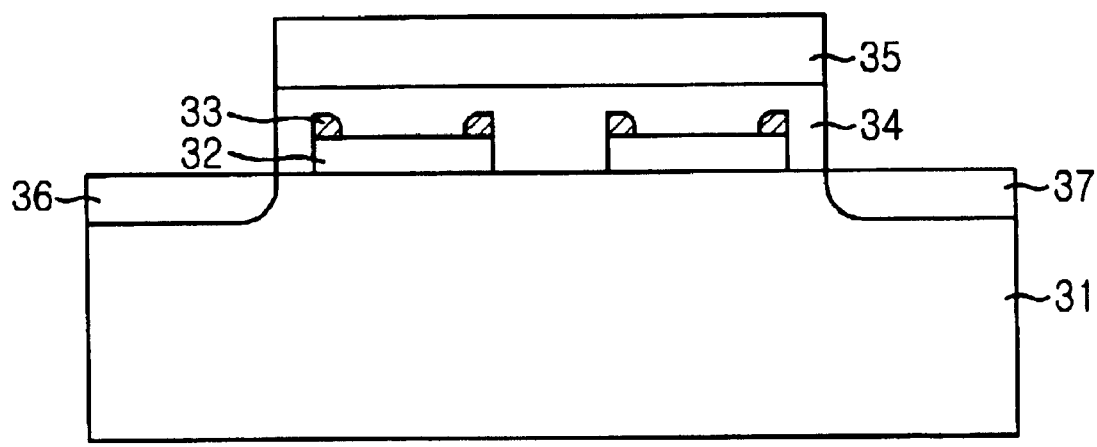
FIG. 4 is a cross-sectional view showing a single electron transistor in accordance with the preferred embodiment of the present invention.

FIG. 4 is a cross-sectional view showing a single electron transistor in accordance with the preferred embodiment of the present invention.

Referring to FIG. 4, a tunneling oxide layer 32 is formed on a semiconductor substrate 31 constructed with silicon or Ge—As. Herein, the tunneling oxide 32 is a silicon oxide layer.

On the tunneling oxide layer 32, a quantum dot 33 is formed. Herein, the quantum dot 33 is a single crystal silicon pattern with a fine size having a length, a width and a height all in about 50 nm. That is, the quantum dot 33 is formed to have a size that provides the coulomb barrier phenomenon occurring when a single electron or a few electrons are tunneled.

A control oxide layer 34 is formed to cover the quantum dot 33. The control oxide layer 34 is a silicon oxide layer or a silicon nitride layer.

Then, a gate electrode 35 is formed on top of the control oxide layer 34. A source area 36 and a drain area 37 is formed by implanting n-type or p-type dopants within the substrate 31 on both lateral sides of the gate electrode 35.

A main principle of the single electron transistor having the structure described in FIG. 4 is identical as of an electrically erasable programmable read only memory (EEPROM) device. The differences are that the single electron transistor can change a threshold voltage with a single electron or a few electrons in contrast to the EEPROM, and can be operated at a lower voltage than the EEPROM. That is, if a voltage greater than the threshold voltage is supplied to the gate electrode 35, an inverse layer is formed on a channel area, and electrons of the source area 36 are induced towards the channel area, thereby reducing channel conductance. With the above-described state, electrons provided from the inverse layer of the channel area are tunneled and enter one by one to the quantum dot 33 through a thin tunneling oxide layer at a room temperature. As the electrons enter to the quantum dot 33, the threshold voltage changes. Therefore, it is preferable to perform programming by tunneling one electron. However, it is difficult to detect a change in the threshold voltage. Hence, the programming is generally carried out by tunneling about 3 to 4 electrons simultaneously to change the threshold voltage in about 1 V.

On the other hand, during an erase operation, if a consistent negative voltage, i.e., a voltage drawing out electrons within the quantum dot 33, is supplied to the gate electrode 35, then, it is possible to draw out the electron from the quantum dot 33.

As a result, the threshold voltage is shifted to the original one, resulting in an ease of classifying '1' or '0' state.

Although the single crystal silicon layer is grown to form the quantum dot by the SEG technique in the above-preferred embodiment, it is still possible to form a various single crystal layer with materials as Si—Ge, Co—Si and the like, which has an epitaxial relation with silicon substrate.

The present invention also provides an effect of improving reliability and massproduction simultaneously by forming a number of quantum dots constructed with single crystal silicon through the SEG technique and the known lithography technique.

While the present invention has been described with respect to certain preferred embodiments, it will be apparent to those skilled in the art that various changes and modifications may be made without departing from the scope of the invention as defined in the following claims.

What is claimed is:

1. A method for forming a quantum dot, comprising the steps of:

forming a first insulating layer on a semiconductor substrate;

forming an opening that exposes the semiconductor substrate by etching the first insulating layer;

forming a single crystal semiconductor layer in the opening and on the first insulating layer adjacent to the opening; and forming a quantum dot on the first insulating layer adjacent to the opening by removing the single crystal semiconductor layer in the opening and portions of the singly crystal layer on the first insulating layer adjacent to the opening.

2. The method as recited in claim 1, the single crystal layer in the opening is formed through a selective epitaxial growth, and the single crystal layer on the first insulating layer adjacent to the opening is formed by a lateral overgrowth.

3. The method as recited in claim 1, further comprising the step of proceeding a thermal process in an atmosphere of hydrogen or in a vacuum state after forming the opening.

4. The method as recited in claim 1, wherein the step of forming the quantum dot further includes the steps of:

forming an etch mask having a first open area and second open areas, wherein the first open area exposes the single crystal semiconductor layer in the opening and the second open areas expose portions of the crystal semiconductor layer on the first insulating layer 2 adjacent to the opening; and forming the quantum dot by etching the exposed single crystal semiconductor layer by using the mask as an etch mask.

5. The method as recited in claim 1, wherein the opening have a square shape, a circular shape or a crisscross shape.

6. The method as recited in claim 1, wherein the single crystal semiconductor layer is epitaxial layer to the semiconductor substrate.

7. The method as recited in claim 6, wherein the semiconductor substrate is silicon substrate.

8. The method as recited in claim 7, wherein the single crystal semiconductor layer is any one layer selected from a group consisting of a silicon layer, a silicon-germanium layer or a cobalt-silicide layer.

9. The method as recited in claim 7, wherein the step of forming the single crystal semiconductor layer uses either $SiH_2Cl_2/H_2/HCl/PH_3$ or $SiH_4/H_2/HCl/PH_3$ as a source gas.

10. The method as recited in claim 1, wherein the first insulating layer is a silicon oxide or a silicon nitride.

11. A method for forming a quantum dot, comprising the steps of:

forming a sub-layer on a substrate;

forming an opening that expose the substrate by etching the sub-layer;

forming a conductive layer in the opening and on the sub-layer adjacent to the opening; and forming a quantum dot by leaving portions of the conductive layer on the sub-layer adjacent to the opening.

12. The method as recited in claim 11, further comprising steps of forming a mask covering the portions of the conductive layer on the sub-layer adjacent to the opening; and selectively etching the conductive layer with the mask and forming the quantum dot.

* * * * *